US012613470B2

(12) United States Patent (10) Patent No.: US 12,613,470 B2
Sin et al. (45) Date of Patent: Apr. 28, 2026

(54) METHODS FOR OPTICAL PROXIMITY CORRECTION AND METHODS OF MANUFACTURING SEMICONDUCTOR DEVICES HAVING THE SAME

(71) Applicant: Samsung Electronics Co., Ltd., Suwon-si (KR)

(72) Inventors: Yujeong Sin, Hwaseong-si (KR); Sunggon Jung, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 923 days.

(21) Appl. No.: 17/891,424

(22) Filed: Aug. 19, 2022

(65) Prior Publication Data

US 2023/0168590 A1 Jun. 1, 2023

(30) Foreign Application Priority Data

Dec. 1, 2021 (KR) ........................ 10-2021-0170196
Feb. 3, 2022 (KR) ........................ 10-2022-0014357

(51) Int. Cl.
*G03F 7/00* (2006.01)
*G03F 1/36* (2012.01)
(Continued)

(52) U.S. Cl.
CPC ............ *G03F 7/70441* (2013.01); *G03F 1/36* (2013.01); *G06F 30/398* (2020.01); *G03F 7/705* (2013.01)

(58) Field of Classification Search
None
See application file for complete search history.

(56) References Cited

U.S. PATENT DOCUMENTS 6,370,679 B1 * 4/2002 Chang ........................ G03F 1/36
430/30
7,475,383 B2 * 1/2009 Suh ........................... G03F 1/36
700/121

(Continued)

FOREIGN PATENT DOCUMENTS

KR 100788372 B1 1/2008
KR 10-2009-0044531 A 5/2009
KR 20140030007 A 3/2014

*Primary Examiner* — Leigh M Garbowski
(74) *Attorney, Agent, or Firm* — Wolf, Greenfield & Sacks, P.C.

(57) ABSTRACT

Methods for optical proximity correction (OPC), which may include inputting curved layout data corresponding to a target layer to be formed; performing manhattanization based on the curved layout data and acquiring manhattanized data; performing fragmentation on the manhattanized data and decomposing the manhattanized data into a plurality of data components; generating an OPC model based on the plurality of data components and performing a simulation on the OPC model to extract a contour of the OPC model; calculating an overlap score between the contour of the OPC model and a layer that is adjacent to the target layer and reflecting the calculated overlap score in the OPC model; and acquiring design data for forming the target layer based on the simulation result. Therefore, it is possible to obtain design data having positioning optimized according to positioning a target layer in consideration of an adjacent layer by the method for optical proximity correction according to some example embodiments of the present disclosure.

20 Claims, 15 Drawing Sheets

(51) Int. Cl.
  G06F 30/30      (2020.01)
  G06F 30/398      (2020.01)

(56)              References Cited

U.S. PATENT DOCUMENTS

| | | | |
|---|---|---|---|
| 7,788,630 B2 * | 8/2010 | Li | G03F 1/36 |
| | | | 716/54 |
| 7,975,246 B2 | 7/2011 | Dunn et al. | |
| 9,679,100 B2 | 6/2017 | Cheng et al. | |
| 9,836,556 B2 | 12/2017 | Lei et al. | |
| 10,445,461 B2 * | 10/2019 | Zhang | G06F 30/20 |
| 10,642,152 B2 | 5/2020 | Wuister et al. | |
| 10,831,977 B1 | 11/2020 | Gheith et al. | |
| 2008/0032211 A1 | 2/2008 | Lee | |
| 2014/0064600 A1 | 3/2014 | Jeong | |
| 2014/0189614 A1 | 7/2014 | Liu et al. | |
| 2016/0291458 A1 | 10/2016 | He et al. | |
| 2021/0240087 A1 | 8/2021 | Yu | |
| 2022/0302176 A1 * | 9/2022 | Kang | H10D 64/258 |
| 2024/0310718 A1 * | 9/2024 | Hamouda | G03F 7/70441 |

* cited by examiner

VTG CA2        CA1

MD2

Y
Z → X

VTG CA2        CA1  DD2

Y
Z●→X

METHODS FOR OPTICAL PROXIMITY CORRECTION AND METHODS OF MANUFACTURING SEMICONDUCTOR DEVICES HAVING THE SAME

CROSS-REFERENCE TO RELATED APPLICATION

This application claims the benefit under 35 U.S.C. § 119(a) of Korean Patent Application No. 10-2021-0170196, filed on Dec. 1, 2021, and of Korean Patent Application No. 10-2022-0014357, filed on Feb. 3, 2022, in the Korean Intellectual Property Office, and the entire contents of each above-identified application are incorporated by reference herein for all purposes.

TECHNICAL FIELD

The present disclosure relates to methods for optical proximity correction and to methods of manufacturing semi-conductor devices having the optical proximity correction methods.

BACKGROUND

As part of manufacturing a semiconductor device, a lithography process may include transferring a circuit pattern previously formed on a photomask through exposure and development to a photoresist formed on a substrate. Recently, as patterns constituting semiconductor devices are miniaturized, there is increasing usage of lithography techniques using extreme ultraviolet light and electron beams. Meanwhile, as patterns become increasingly miniaturized, an optical proximity effect (OPE) in which the patterns formed on the photomask may become distorted and transferred to the substrate may occur, due in part to the influence between neighboring patterns. An optical proximity correction (OPC) method may be performed to overcome the optical proximity effect and minimize a difference between layout data and patterns formed on the semiconductor substrate.

SUMMARY

Aspects of the present disclosure may provide methods for optical proximity correction that are capable of manufacturing a photomask accurately forming a target layer by inputting curved layout data having the same shape as a target layer to perform manhattanization, and generating an OPC model in consideration of adjacent layers.

According to some example embodiments, a method for optical proximity correction may include inputting curved layout data corresponding to a target layer to be formed, performing manhattanization based on the curved layout data and acquiring manhattanized data, performing fragmentation on the manhattanized data and decomposing the manhattanized data into a plurality of data components, generating an OPC model based on the plurality of data components and performing a simulation on the OPC model to extract a contour of the OPC model, calculating an overlap score between the contour of the OPC model and a layer that is adjacent to the target layer, adjusting the OPC model based on the calculated overlap score, and acquiring design data for forming the target layer based on the simulation result.

According to some example embodiments, a method for optical proximity correction may include inputting curved layout data corresponding to a target layer to be formed, performing manhattanization based on the curved layout data and acquiring manhattanized data, performing a simulation for correcting an optical proximity effect using the manhattanized data, and acquiring design data for forming the target layer without modifying the curved layout data based on the simulation result.

According to some example embodiments, a method of manufacturing a semiconductor device may include performing manhattanization on curved layout data for a target layer, and performing optical proximity correction (OPC) based on the manhattanized data, acquiring design data by the optical proximity correction, and forming a photoresist pattern on a substrate using a photomask manufactured based on the design data.

BRIEF DESCRIPTION OF DRAWINGS

The above and other aspects, features, and advantages of the present inventive concepts will be more clearly under-stood from the following detailed description, taken in conjunction with the accompanying drawings, in which.

DETAILED DESCRIPTION

Hereinafter, some example embodiments in the present disclosure will be described with reference to the accompa-nying drawings.

Figure 1:
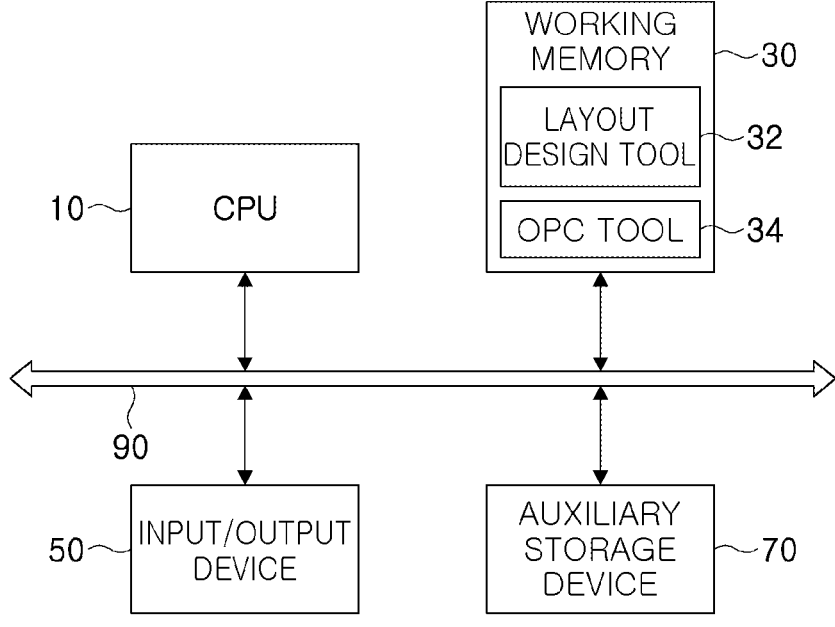
FIG. 1 is a block diagram schematically illustrating a computer system for performing a method for optical prox-imity correction according to some example embodiments of the present disclosure.

FIG. 1 is a block diagram schematically illustrating a computer system for performing a method for optical prox-imity correction according to some example embodiments of the present disclosure.

Referring to FIG. 1, a computer system may include a CPU 10, a working memory 30, an input/output device 50, and an auxiliary storage device 70. In some embodiments, the computer system may be provided as a dedicated device for performing (or configured to perform) a method for optical proximity correction according to the present disclosure and the example embodiments thereof. In some embodiments, the computer system may be equipped with various design and verification simulation programs.

The CPU 10 may execute software (application programs, operating systems, device drivers) comprising instructions and/or features to be performed by the computer system. For example, the CPU 10 may execute an operating system (OS) loaded into a working memory 30. The CPU 10 may execute various application programs to be driven based on the operating system. As an example, the CPU 10 may execute a layout design tool 32 and/or an OPC tool 34 loaded into the working memory 30.

An operating system or application programs may be loaded into the working memory 30. When the computer system is booted, an OS image stored in an auxiliary storage device 70 may be loaded into the working memory 30 based on a booting sequence. All input/output operations of the computer system may be supported by the operating system. Application programs may be selected by a user and/or application programs for basic service provision may be loaded into the working memory 30. The layout design tool 32 and/or the OPC tool 34 may be loaded into the working memory 30 from the auxiliary storage device 70.

The working memory 30 may be a volatile memory, such as a static random access memory (SRAM) or a dynamic random access memory (DRAM), or the working memory 30 may be a nonvolatile memory, such as a phase-change random access memory (PRAM), a magnetoresistive random access memory (MRAM), a ferroelectric random access memory (FRAM), or a NOR flash memory. The present disclosure is not limited to these examples of volatile and nonvolatile memories.

The layout design tool 32 may have a bias function that may change a shape and position of specific layout patterns to be different from those defined by a design rule. The layout design tool 32 may perform a design rule check (DRC) in the changed bias data condition.

In methods for optical proximity correction according to some example embodiments of the present disclosure, layout data may have a curved shape. For example, the layout data may be the same as a shape of a target layer to be formed using the manufactured photomask. However, this is only an example, and the present disclosure may not be limited in this manner. The OPC tool 34 may perform optical proximity correction (OPC) on the layout data output from the layout design tool 32.

The input/output device 50 may control user input and output from user interface devices. For example, the input/output device 50 may include a keyboard or a monitor, and the computer system may receive information from a designer or other device through the input/output device 50. The input/output device 50 may display a processing process, a processing result, and the like of the OPC tool 34.

The auxiliary storage device 70 may be provided as a storage medium of a computer system. The auxiliary storage device 70 may store application programs, an operating system image, and various data. The auxiliary storage device 70 may be provided as a memory card such as MMC, eMMC, SD, and MicroSD, or a hard disk drive (HDD), as examples. Alternatively, the auxiliary storage device 70 may include a non-volatile memory such as PRAM, MRAM, or NOR flash memory, again as examples.

The computer system may also include a system interconnector 90, which may be a system bus for providing a network inside the computer system. The CPU 10, the working memory 30, the input/output device 50, and the auxiliary storage device 70 may be electrically connected to each other through the system interconnector 90, and may exchange data with each other. However, the configurations of the computer system may not be limited to those illustrated in FIG. 1, and may further include additional configurations.

Figure 2:
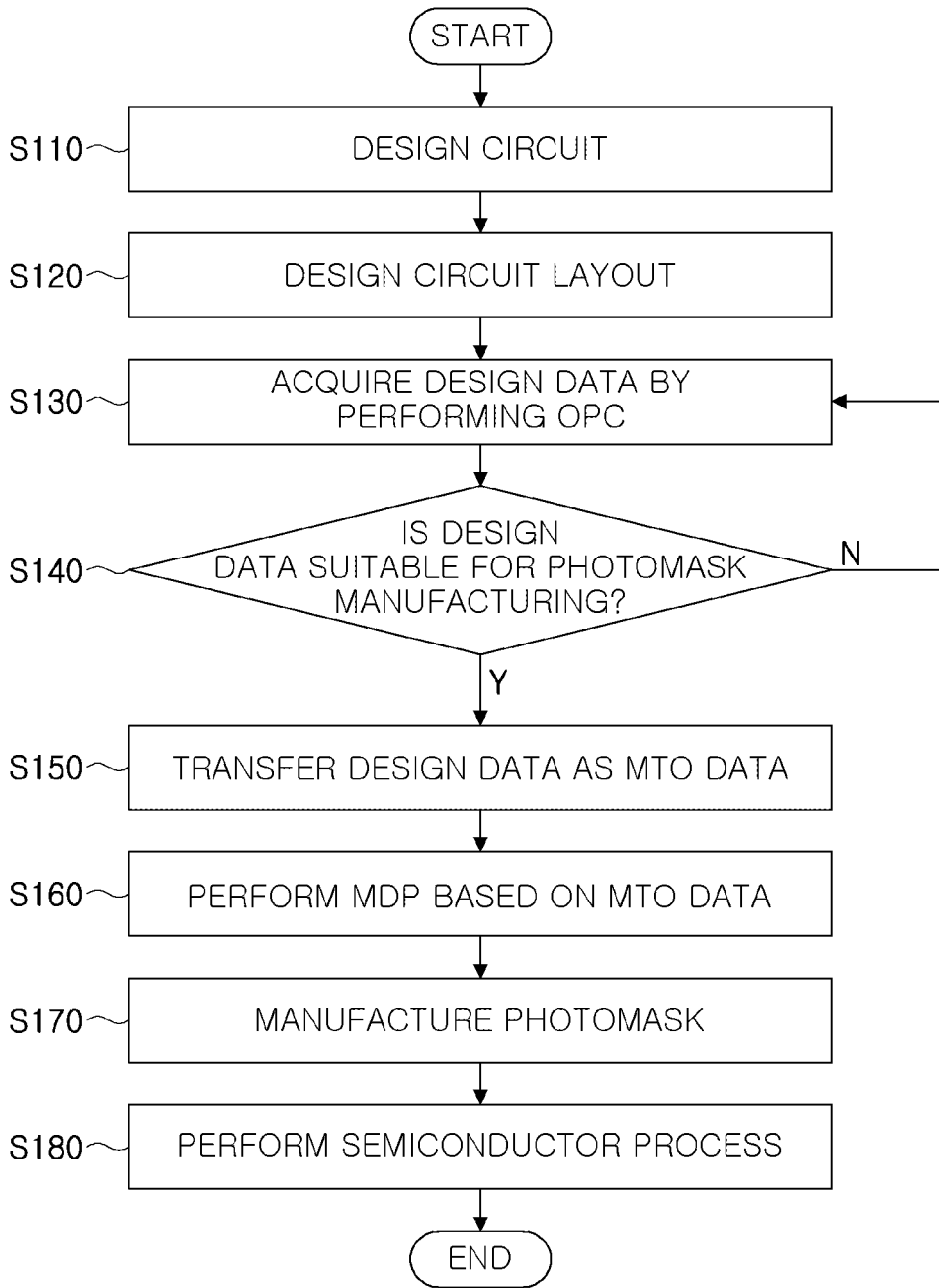
FIG. 2 is a flowchart illustrating operations of methods of manufacturing a semiconductor device according to some example embodiments of the present disclosure.

FIG. 2 is a flowchart illustrating a method of manufacturing a semiconductor device according to some example embodiments of the present disclosure.

Referring to FIG. 2, a method of manufacturing a semiconductor device according to some example embodiments of the present disclosure may include a process of forming various patterns on a semiconductor substrate and/or layers formed on the semiconductor substrate by various semiconductor processes, such as a deposition process, an etching process, and/or a polishing process. Accordingly, the method of manufacturing a semiconductor device may include performing a lithography process for manufacturing a photomask based on layout data having a shape corresponding to a pattern of a target layer, and forming a pattern on a semiconductor substrate in a semiconductor process using the manufactured photomask.

In order to manufacture the photomask, a circuit may be first designed (S110) and a layout for a pattern of the circuit may be designed (S120). In this case, the designed circuit pattern may correspond to a circuit and interconnection that are related (e.g., directly related) to the operation of the semiconductor device, and the layout may refer to a physical structure in which the circuit may be transferred onto a wafer.

Thereafter, the optical proximity correction may be performed on the layout of the pattern (S130). The method for optical proximity correction according to some example embodiments of the present disclosure may use curved layout data corresponding to a target layer as input data and perform manhattanization on the input curved layout data, and then may be performed based on the manhattanized data. As discussed herein, manhattanization may be a process of transforming the input curved layout data into polygonal data including patterns of 0°, 45°, or 90°, according to a predetermined rule. In addition, a simulation included in the method for optical proximity correction according to some example embodiments of the present disclosure may be performed using an overlap score calculated based on a degree of overlap between the contour of the OPC model and a layer adjacent to the target layer.

The method for optical proximity correction may be performed one or more times until it is determined that the design data obtained through the method for optical proximity correction is suitable for photomask manufacturing (S140). When the design data obtained through the method for optical proximity correction is design data suitable for photomask manufacturing (Y branch from S140), the design data may be transmitted as mask tape-out (MTO) design data (S150). As an example, the MTO design data may be data for requesting mask manufacturing based on the design data of the photomask on which the optical proximity correction is performed. The MTO design data may have a graphic data format used in electronic design automation software or the like.

When the MTO design data is transferred, mask data preparation (MDP) may be performed (S160). The MDP may include format transformation, augmentation, and verification. After performing the MDP, a photomask may be manufactured through a front end of line (FEOL) and a back end of line (BEOL) (S170). For example, the front end of line (FEOL) may include an exposure process, a chemical treatment process, and/or a measurement process for the mask (as examples), and the back end of line (BEOL) may include processes such as defect inspection, defect repair, and/or pellicle application (as examples).

A semiconductor process of forming a photoresist pattern on a semiconductor substrate may be performed using a photomask manufactured based on the design data (S180). When the etching process is described as an example, an etching process of removing at least a portion of the semiconductor substrate or layers on the semiconductor substrate may be performed in an area exposed by patterns included in the mask. By the etching process as described above, predetermined patterns may be formed on the semiconductor substrate.

Existing methods for optical proximity correction uses linear layout data as input data. However, as semiconductor devices and/or types thereof become increasingly complex and as a degree of integration increases, errors occurring during a process of manufacturing a photomask from layout data and/or a process of performing a semiconductor process using the photomask may increase. For this reason, when the photomask is manufactured according to the existing methods for optical proximity correction, the patterns of the actually formed layer and the target layer differ, so a problem occurs where of input data, processing conditions, or the like needs to be changed.

In some example embodiments of the present disclosure, a process of using the curved layout data as the input data may be performed, and a calculating of the overlap score based on whether or not the layer adjacent to the target layer and the contour of the OPC model overlap with each other may be performed, and these processes may be applied in the next repeated simulation. Accordingly, methods for optical proximity correction according to some example embodiments of the present disclosure may improve the consistency between the patterns of the actually formed layer and the target layer, without changing the input data.

Figure 3:
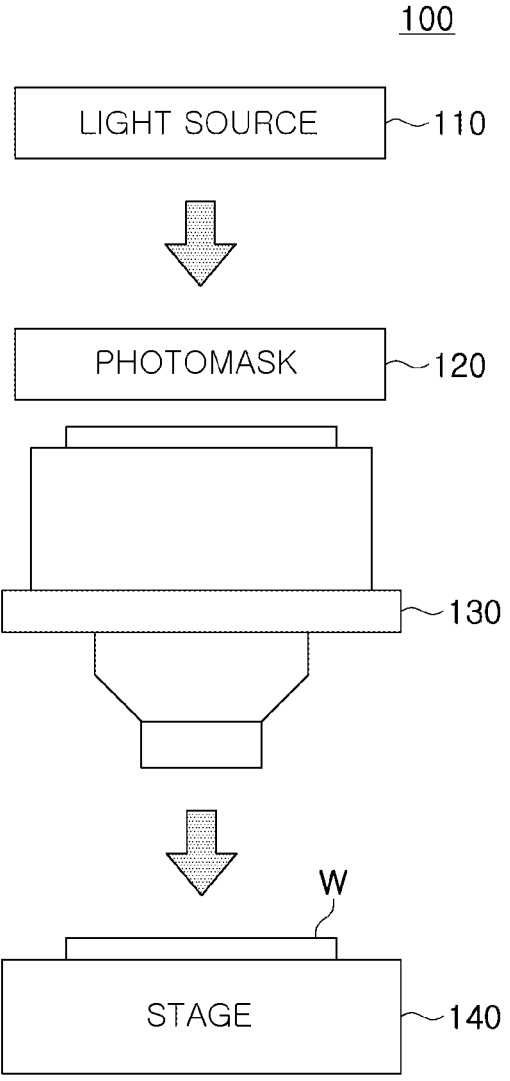
FIG. 3 is a diagram for describing a photolithography system using a photomask manufactured according to meth-ods for optical proximity correction according to some example embodiments of the present disclosure.
Figure 3:
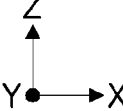

FIG. 3 is a diagram for describing a photolithography system using a photomask manufactured according to methods for optical proximity correction according to some example embodiments of the present disclosure.

Referring to FIG. 3, a photolithography system 100 may include a light source 110, a photomask 120, a reduction projection device 130, a substrate stage 140, and the like. However, the photolithography system 100 may further include components not illustrated in FIG. 3. For example, the photolithography system 100 may further include a sensor for measuring a height and inclination of a surface of a semiconductor substrate W, and/or the like.

The light source 110 may emit light of a specific wavelength. Light emitted from the light source 110 may be irradiated to the photomask 120. For example, a lens may be arranged between the light source 110 and the photomask 120 to adjust a light focus. The light source 110 may include an ultraviolet light source (e.g., a KrF light source having a wavelength of 234 nm, an ArF light source having a wavelength of 193 nm, or the like). The light source 110 may include one point light source or a plurality of point light sources.

The light source 110 may be a light source emitting extreme ultraviolet (EUV) having a wavelength between 4 nm and 124 nm. For example, the light source 110 may emit extreme ultraviolet light having a wavelength between 4 nm and 20 nm, and in some example embodiments, the wavelength of the extreme ultraviolet light may be 13.5 nm. When the light source 110 emits extreme ultraviolet light, the photomask 120 may be made of a material different from that in the case where the light source 110 emits ultraviolet light. For example, with respect to the light source 110 emitting the extreme ultraviolet light, the photomask 120 may include a plurality of silicon layers and a plurality of molybdenum layers that are alternately stacked, and a ruthenium layer may be further arranged on the plurality of silicon layers and the plurality of molybdenum layers. However, this is only one example embodiment, and the present disclosure is not limited thereto. The material and stacked structure of the photomask 120 upon which the light source 110 emits the extreme ultraviolet light may be variously modified.

In order to implement the pre-designed circuit layout on the semiconductor substrate W, the photomask 120 may include patterns having various sizes and shapes. The patterns may be formed based on the design data on which the optical proximity correction performed by the OPC tool 34 or the like is performed based on the layout data generated by the layout design tool 32 or the like illustrated in FIG. 1. The patterns may be defined by a transparent area and an opaque area. The transparent region may be formed by etching a metal layer (e.g., a Cr film) on the photomask 120. The transparent area may allow light emitted from the light source 110 to pass therethrough. On the other hand, the opaque area may be an area that blocks light without passing therethrough.

Light passing through the transparent area of the photomask 120 may be incident on the reduction projection device 130. The reduction projection device 130 may match patterns to be formed on the semiconductor substrate W with the patterns of the photomask 120. Light passing through the transparent area of the photomask 120 may be irradiated onto the semiconductor substrate W through the reduction projection device 130. Accordingly, the patterns corresponding to the patterns of the photomask 120 may be formed on the semiconductor substrate W.

The substrate stage 140 may support the semiconductor substrate W. For example, the semiconductor substrate W may include a silicon wafer. The reduction projection device 130 may include an aperture. The aperture may be used for the purpose of increasing a focal depth of ultraviolet light or extreme ultraviolet light emitted from the light source 110. As an example, the aperture may include a dipole aperture or a quadruple aperture. The reduction projection device 130 may further include a lens to adjust the light focus.

As the size of the semiconductor device decreases and the degree of integration increases, a distance between image patterns of the photomask 120 may be relatively very small. The interference and diffraction of light may occur due to such proximity, and a distorted pattern different from the actual design may be formed on the semiconductor substrate W. When the distorted pattern is printed on the substrate W, the designed circuit may not operate or may operate abnormally.

In order to prevent the distortion of the pattern, a resolution enhancement technology such as optical proximity correction may be used. In optical proximity correction, the degree of distortion of light caused by the interference, the diffraction of light, and the like may be predicted in advance by the simulation of the OPC model, and the layout for manufacturing the photomask 120 may be adjusted based on the predicted result. The patterns may be formed on the mask 120 based on the changed layout, and the patterns may be accurately formed on the semiconductor substrate W.

The layout of the semiconductor device may include a plurality of layers. A method for optical proximity correction according to the example embodiments of the present disclosure may be performed to adjust the layout of a single layer. In other words, the optical proximity correction may be independently performed for each of the plurality of layers. The semiconductor device may be formed by sequentially implementing a plurality of layers on a substrate through a semiconductor process.

The optical proximity correction for each of the plurality of layers may be performed by the OPC model generated for each of the plurality of layers. Since the performance of the optical proximity correction may be determined according to the accuracy of the OPC model, an operation of verifying and correcting the error of the OPC model in advance may be performed in order to improve the accuracy and yield of the semiconductor process.

For example, the photomask 120 manufactured by a method for optical proximity correction according to the example embodiments of the present disclosure may be used to form an ion implantation layer of an image sensor. The ion implantation layer may be, for example, a layer corresponding to a floating diffusion region. That is, in the method for optical proximity correction according to the example embodiments of the present disclosure, the target layer may correspond to the floating diffusion region constituting the image sensor.

Accordingly, the adjacent layer may include a contact and a transmission gate structure constituting the image sensor. In this case, the transfer gate structure may be a vertical transfer gate (VTG) constituting a transfer transistor. However, this is only an example embodiment, and the present disclosure may not be limited as such. Methods for optical proximity correction according to the example embodiments of the present disclosure may be used for manufacturing various semiconductor devices other than the image sensor. For example, when the target layer formed during the semiconductor device manufacturing process has a complex structure, such as a curved shape or a "C" shape, the effect of a method for optical proximity correction according to the example embodiments of the present disclosure may be maximized.

FIGS. 4A to 4D are diagrams illustrating a general method for optical proximity correction.

Figures 4A, 4B, 4C, 4D:
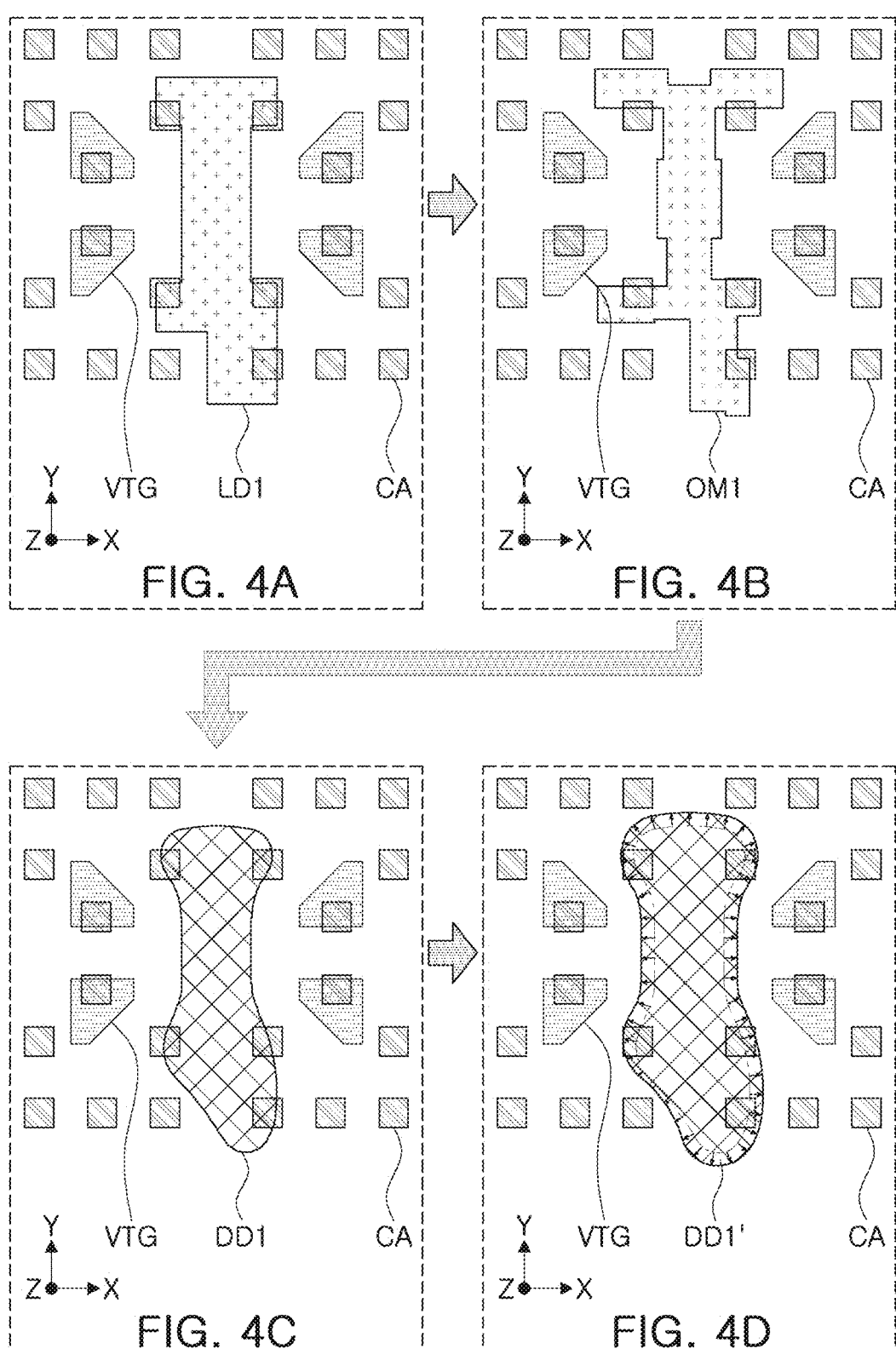
FIGS. 4A to 4D are diagrams illustrating a general method for optical proximity correction.

Referring to FIG. 4A, in general, the method for optical proximity correction may use polygon-type layout data having a pattern of 0°, 45°, or 90° as input data. For example, the polygonal layout data may be defined as a first layout data LD1. In this case, the first layout data LD1 may be layout data for forming a target layer that overlaps at least one of the plurality of contacts CA and does not overlap with the other plurality of contacts CA and the transmission gate structure VTG.

Referring to FIG. 4B, the optical proximity correction may be performed by a method of performing fragmentation on the first layout data LD1 to generate a first OPC model OM1 and performing a simulation using the first OPC model OM1. The simulation of the optical proximity correction may be repeatedly performed so that a first design data DD1 obtained as a result of the optical proximity correction corresponds to the target layer.

However, as illustrated in FIG. 4C, even though the optical proximity correction is performed, the first design data DD1 obtained based on the first layout data LD1 may not properly correspond to the target layer. For example, the first design data DD1 may not completely overlap the at least one contact CA overlapping the target layer. Accordingly, defects may occur in the pattern of the layer formed according to the first design data DD1.

Referring to FIG. 4D, a first design data DD1' compensated by changing process conditions such as increasing a photo dose in order to solve a pattern defect problem of the layer may be acquired. However, this is only one example, and the pattern defect problem of the layer may be solved differently, for example by modifying the shape of the first layout data LD1. Such problem solving methods may result in an increase in time cost and economic cost.

Figure 5:
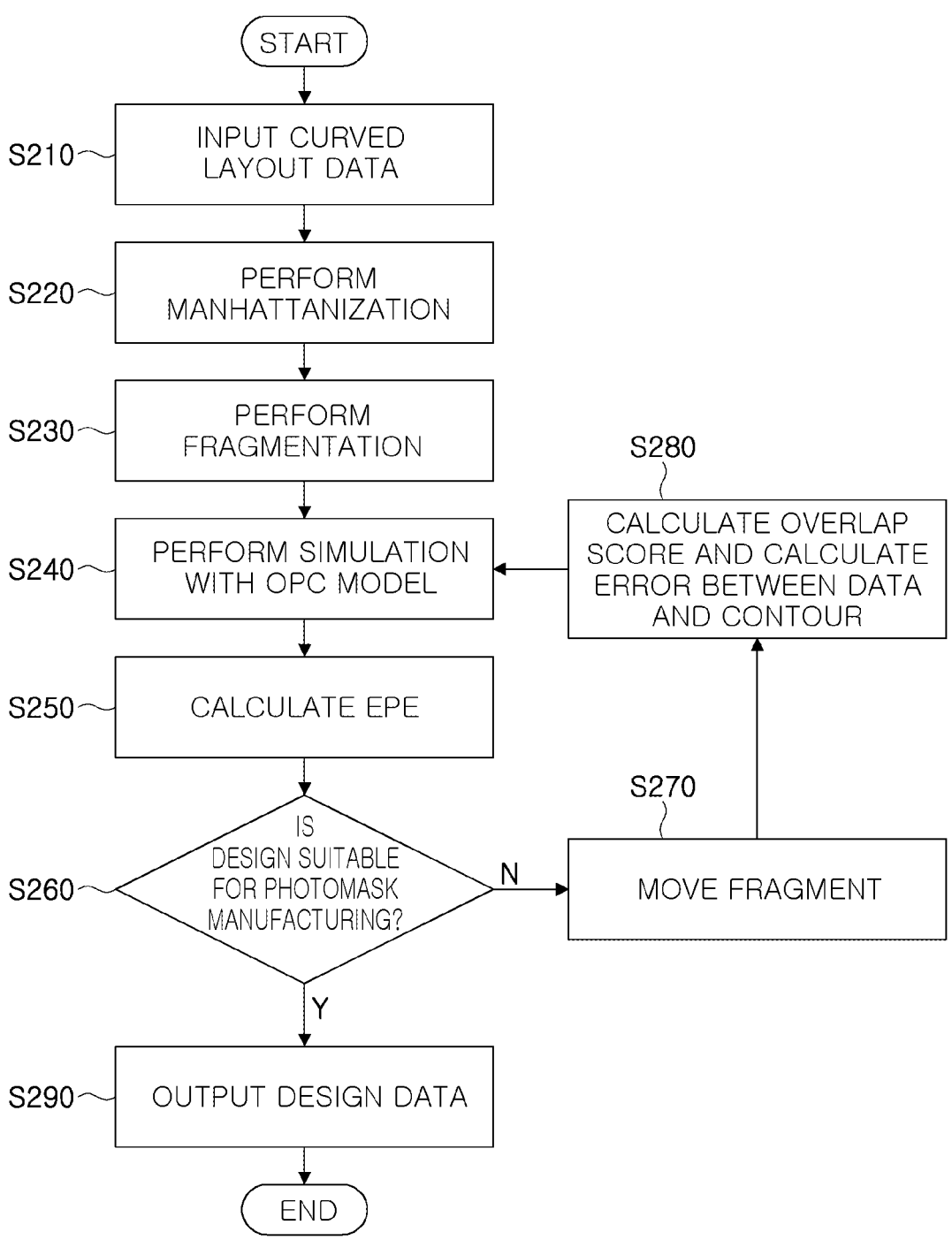
FIG. 5 is a flowchart for describing operations of methods for optical proximity correction according to some example embodiments of the present disclosure.

FIG. 5 is a flowchart for describing methods for optical proximity correction according to some example embodiments of the present disclosure.

Referring to FIG. 5, in the method for optical proximity correction according to some example embodiments of the present disclosure, the shape of layout data may be changed in order to solve a pattern defect problem of a layer while minimizing the increase in time cost and economic cost. For example, the layout data input to form the target layer may be curved layout data (S210).

On the other hand, when the optical proximity correction is directly performed based on the curved layout data, an additional cost may be consumed. Therefore, the method for optical proximity correction according to some example embodiments of the present disclosure may acquire manhattanized data by performing manhattanization based on the curved layout data (S220).

For example, the manhattanization process may be a process of transforming the curved data into the polygonal data including a pattern of 0°, 45°, or 90°, according to a predetermined rule. In some embodiments, the manhattanization process may be a process of transforming the curved data into the polygonal data including a pattern using only 0°, 45°, and/or 90° angles, according to a predetermined rule. However, the specific method of the manhattanization may not be limited thereto. For example, stair stepping may be performed in various methods according to the type of semiconductor device, the complexity of patterns, the type of semiconductor process, and/or the like.

The manhattanized data may be decomposed into a plurality of data components through fragmentation (S230). For example, the fragmentation may correspond to a process of defining the manhattanized data into a plurality of data components in order to generate the OPC model suitable for the optical proximity correction by performing compensation on the manhattanized data.

The OPC model may be a simulation model for forming the target layer. For example, information on the plurality of data components may be applied in the OPC model, and information data such as a thickness, a refractive index, and a dielectric constant of photoresist as well as source map information on a type of illumination system may be applied. However, these types of information data are only examples and the present disclosure may not be limited thereto.

The OPC model may be generated based on the plurality of data components defined by the fragmentation, and the simulation may be performed by the generated OPC model (S240). Referring to FIG. 5, the first OPC model may be generated without any special compensation and is illustrated as a basis for simulation, but this is only an example embodiment and the present disclosure may not be limited thereto. As an example, the OPC model may be generated involving the movement of the plurality of data components, for example, a fragment.

In a method for optical proximity correction according to some example embodiments of the present disclosure, after the fragmentation is performed, the contour may be extracted through the simulation of the OPC model. The contour of the OPC model may be a result acquired through the simulation using the OPC model, and may correspond to a layer formed on the semiconductor substrate through the exposure process using the photomask. Therefore, making the contour similar to the shape of the target layer as possible may correspond to the purpose of the method for optical proximity correction.

In order to make the shape of the target layer and the contour of the OPC model as similar as possible, the method may include calculating an edge placement error (EPE) between the target layer and the contour of the OPC model (S250). For example, the EPE may mean a difference between the contour and the edge of the target layer. It may be determined whether the design data obtained through the optical proximity correction is suitable for photomask manufacturing according to the size of the EPE (S260).

For example, when the EPE is large, the difference between the contour and the target layer may be large, which may mean that the layout of the corresponding photomask is not suitable for forming the target layer. Therefore, in order to implement the photomask suitable for forming the target layer, it may be needed or necessary to a process of modifying the OPC model to lower the EPE to less than a set reference value.

In a method for optical proximity correction according to some example embodiments of the present disclosure, the fragment may be moved based on the calculated EPE in order to lower the EPE to less than the set reference value (S270), and/or the overlap score in which the degree of overlap between the contour of the OPC model and the layer adjacent to the target layer is applied may be calculated (S280). The calculated overlap score may be applied in the OPC model, and thus, the difference between the contour and the target layer may be reduced. Stated differently, the OPC model may be adjusted based on the calculated overlap score and/or adjusted based on the difference between the contour and the target layer.

Steps S240 to S280 of performing the simulation based on the OPC model to optimize the design data and acquiring the design data corresponding thereto may be repeatedly performed. When the design data obtained by the optical proximity correction according to steps S210 to S280 is design data suitable for manufacturing the photomask for forming the target layer, the design data may be output as MTO data. In this case, as the design data is optimized, the design data may become closer to the curved layout data corresponding to the input data.

According to the methods for optical proximity correction according to some example embodiments of the present disclosure, it may be possible to obtain the optimal design data for forming the target layer without modifying the curved layout data used as the input data. Accordingly, it may be possible to solve the pattern defect problem of the target layer by making the contour similar to the shape of the target layer as possible while minimizing the increase in time cost and economic cost.

Figure 6:
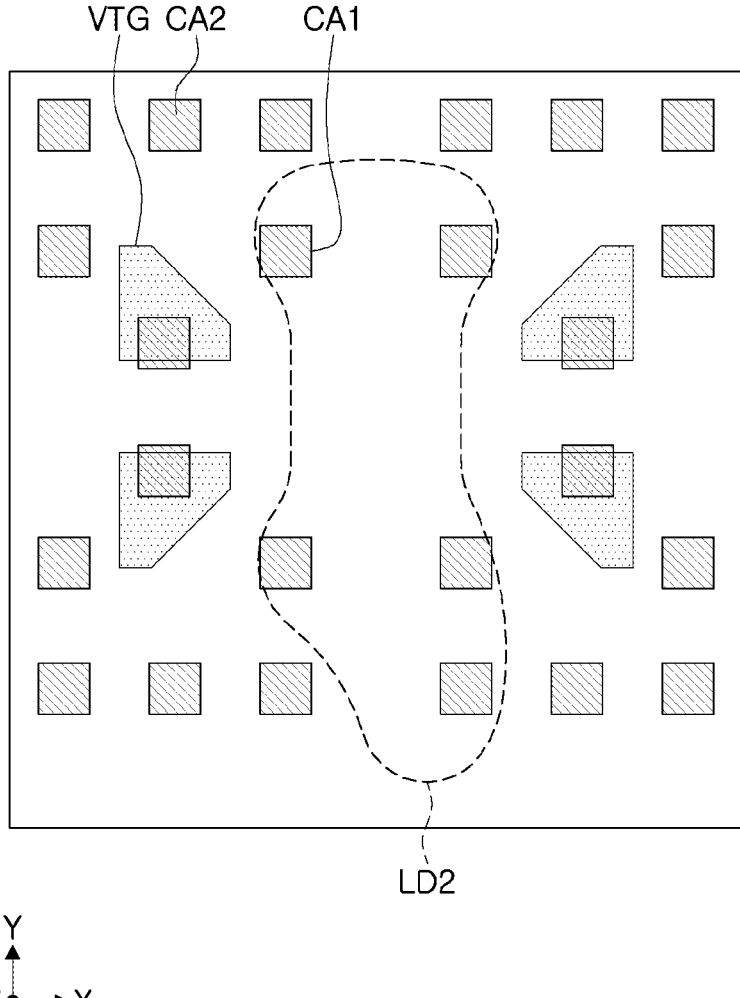
FIG. 6 is a diagram for describing layout data input to methods for optical proximity correction according to some example embodiments of the present disclosure.

FIG. 6 is a diagram for describing the layout data input to methods for optical proximity correction according to some example embodiments of the present disclosure.

As described above, in methods for optical proximity correction according to some example embodiments of the present disclosure, the input data may be the curved layout data. Referring to FIG. 6, the curved layout data may be defined as second layout data LD2. In this case, the second layout data LD2 may have the same shape as the image of the target layer.

The target layer may be formed to overlap a first contact CA1 formed inside the target layer in a first direction (e.g., Z direction). Meanwhile, the target layer may be formed so as not to overlap a second contact CA2 formed outside the target layer in the first direction. In addition, the target layer may be formed so as not to overlap the transfer gate structure VTG formed as a vertical transfer gate in a second direction (e.g., X direction) and a third direction (e.g., Y direction) each perpendicular to the first direction.

Accordingly, the layout data LD2 may be data that overlaps the first contact CA1 in the first direction (e.g., the Z direction), does not overlap the second contact CA2 in the first direction, and does not overlap the transfer gate structure VTG in the second direction (e.g., X direction) and the third direction (e.g., Y direction) perpendicular to the first direction.

Method for optical proximity correction according to some example embodiments of the present disclosure may be performed in consideration of the degree of overlap between the layer adjacent to the target layer and the contour acquired by the optical proximity correction. As an example, the adjacent layer may include a first layer overlapping the target layer and a second layer not overlapping the target layer. In some example embodiments, a method for optical proximity correction may be performed such that, as a result of the simulation, a contour is extracted that overlaps the first layer as much as possible and does not overlap the second layer as much as possible.

In FIG. 6, the second layer may include at least one first pattern that does not overlap the target layer on the same plane (e.g., X-Y plane) as the target layer. For example, the transfer gate structure VTG of FIG. 6 may be one of the at least one first patterns. The second layer may also include at least one second pattern, for example, a second contact CA2 that does not overlap the target layer in a first direction perpendicular to the upper surface of the target layer.

Figure 7:
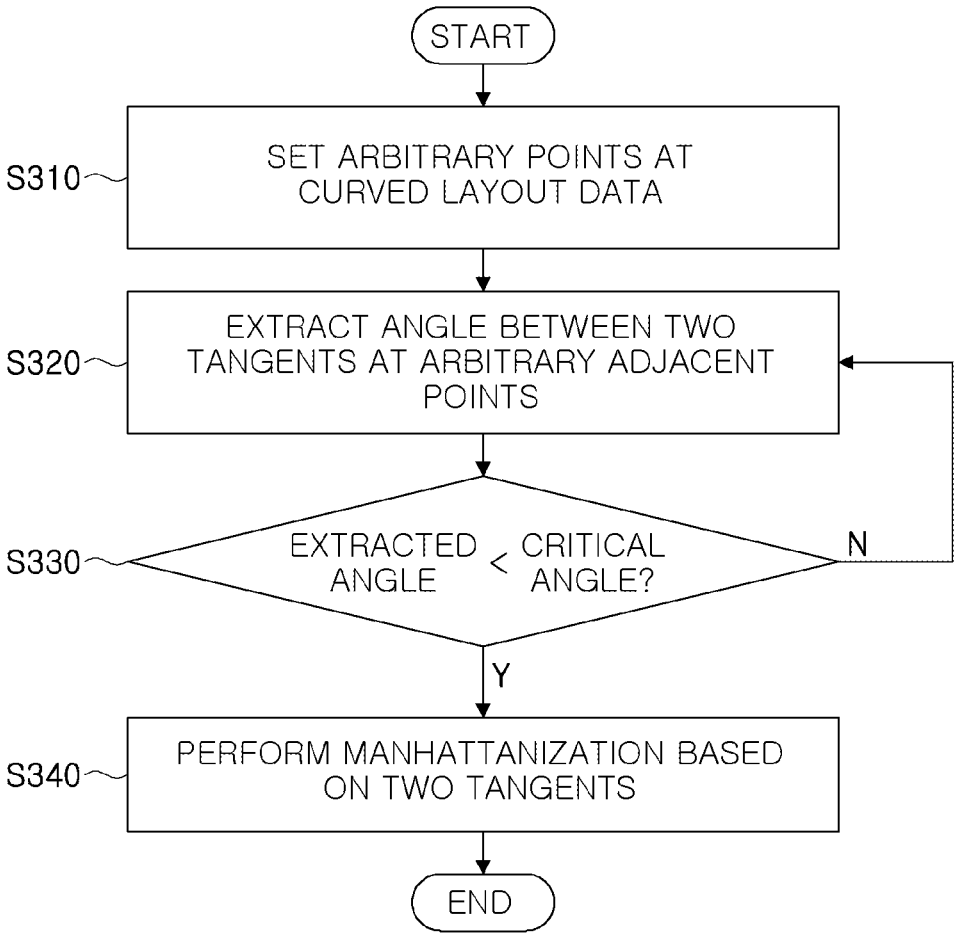
FIGS. 7 to 9 are diagrams illustrating a manhattanization step included in methods for optical proximity correction according to some example embodiments of the present disclosure.
Figure 8:
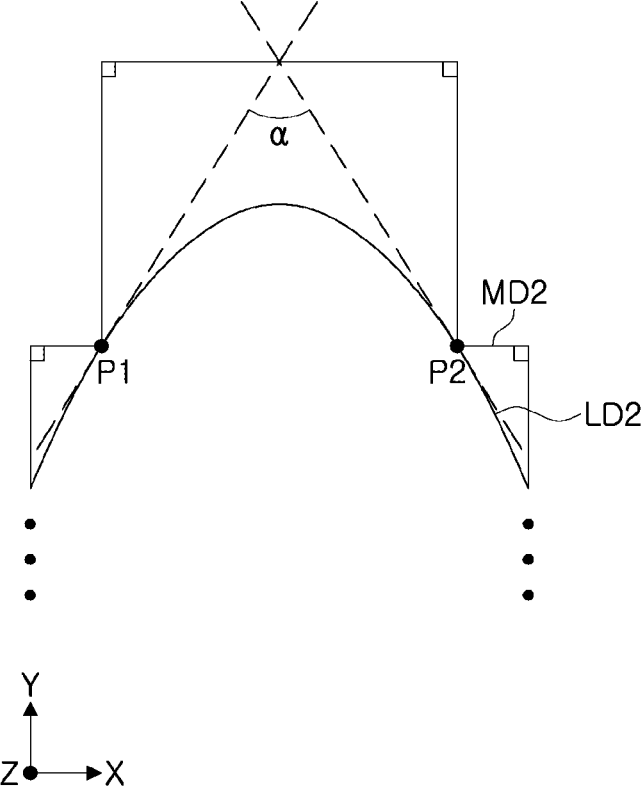
Figure 9:
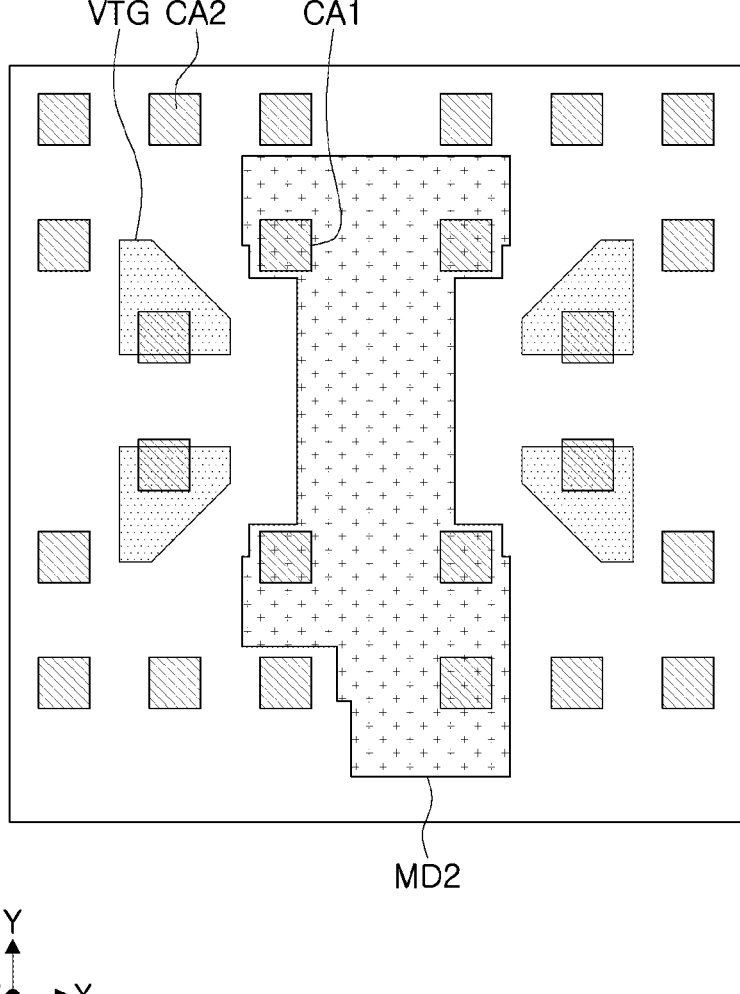

FIGS. 7 to 9 are diagrams illustrating a manhattanization step included in methods for optical proximity correction according to some example embodiments of the present disclosure.

FIGS. 7 to 9 may be diagrams illustrating step S220 of FIG. 5. As described above, in methods for optical proximity correction according to some example embodiments of the present disclosure, the curved layout data corresponding to the input data may be transformed into data for which the optical proximity correction may be performed through manhattanization.

Referring to FIGS. 7 and 8, in order to perform the manhattanization, first, arbitrary adjacent points in the curved layout data may be set (S310). For example, adjacent first points P1 and second points P2 may be set in the second layout data LD2.

Meanwhile, after extracting an angle formed by the two tangents at arbitrary adjacent points (S320), and if the extracted angle is smaller than a critical angle (S330), the manhattanization may be performed based on the two tangents (S340). As an example, when the angle a between the tangents of the first points P1 and the second points P2, respectively, is smaller than the critical angle, a manhattanized data MD2 having a polygonal shape may be acquired based on the two tangents. As an example, the critical angle may be an acute angle greater than 0° and less than 90°.

However, the manhattanization method (and thus, the present disclosure) may not be limited to the method illustrated in FIGS. 7 and 8. As an example, the manhattanization of the curved layout data may be performed in a manner that does not use any adjacent points and/or tangents.

Referring to FIG. 9, the curved layout data may be transformed into the manhattanized data (MD2). The manhattanized data MD2 may be polygonal data. FIG. 9 illustrates that the manhattanized data MD2 may overlap the first contact CA1 in the first direction (e.g., Z direction) and does not overlap the second contact CA2 and the transmission gate structure VTG, but the present disclosure may not be limited thereto.

Figure 10:
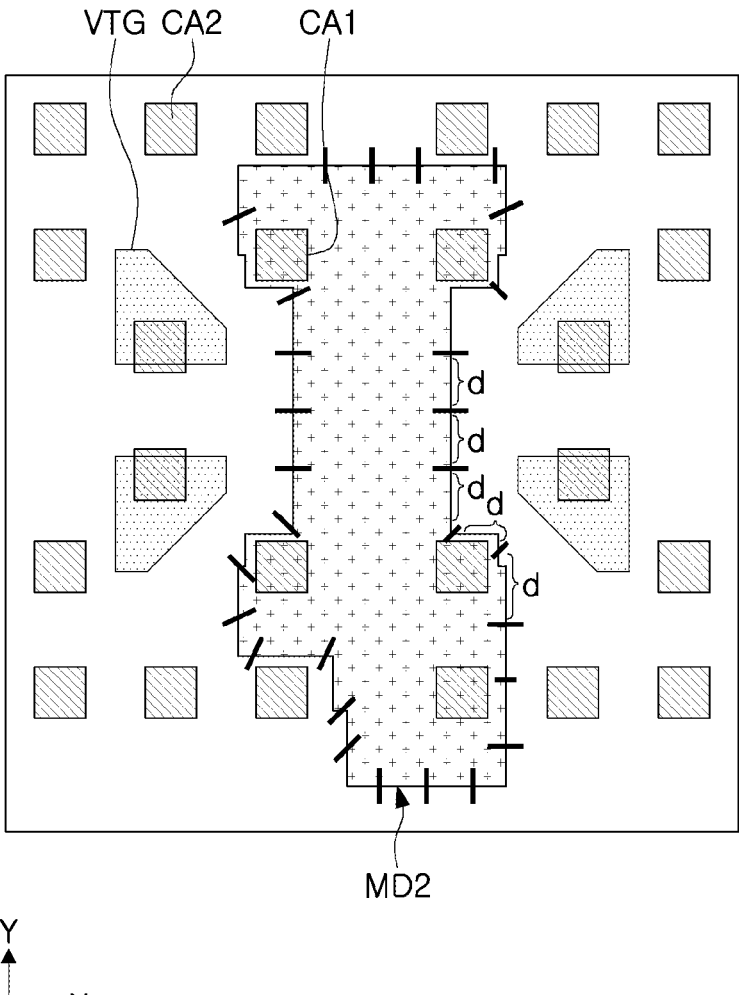
FIGS. 10 and 11 are diagrams illustrating a fragmentation step included in methods for optical proximity correction according to some example embodiments of the present disclosure.
Figure 11:
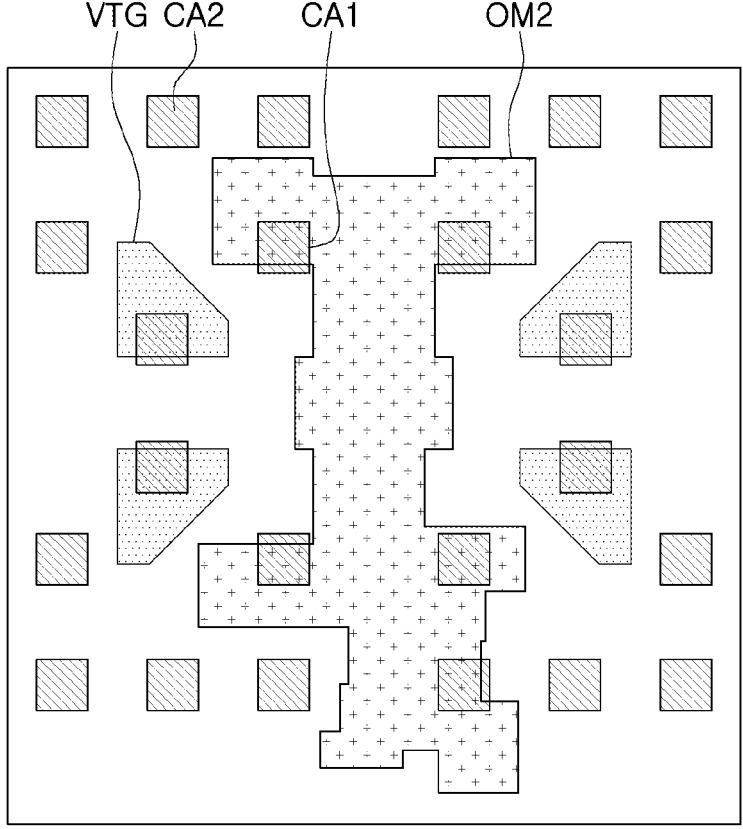

FIGS. 10 and 11 are diagrams illustrating the fragmentation step included in methods for optical proximity correction according to some example embodiments of the present disclosure.

FIGS. 10 and 11 may be diagrams illustrating step S230 of FIG. 5. As described above, in methods for optical proximity correction according to some example embodiments of the present disclosure, the manhattanized data MD2 may be decomposed into the plurality of data components d through the fragmentation. The information on the plurality of data components d may be applied in the OPC model, and design data may be acquired that is capable of being used in manufacturing the photomask for forming the target layer through the optical proximity correction based on the simulation of the OPC model.

Referring to FIG. 10, the manhattanized data MD2 may be divided into a plurality of data components d, for example, into fragments based on a plurality of set dividing points. However, although the plurality of data elements d illustrated in FIG. 10 are illustrated to be physically divided, this is provided conceptually for convenience and the present disclosure is not limited thereto. Accordingly, the division of the fragment disclosed in this specification may not be limited to physical division.

Each of the plurality of data components d divided in the method for optical proximity correction according to the example embodiment of the present disclosure may be a target of an independent bias. For example, any one of the plurality of divided data elements d may be biased in a different direction (e.g., –X direction, Y direction, or –Y direction) from other data elements d biased in one direction (e.g., X direction). At least one of the plurality of data elements d may not be biased.

Referring to FIG. 11, the second OPC model OM2 may be an example of the OPC model generated based on a plurality of biased data components d. Each of the plurality of divided data elements d may be biased to reduce an error between an actual pattern of a layer implemented on a semiconductor substrate and a pattern of a target layer. Generating the second OPC model OM2 by biasing the plurality of divided data components d may be performed by an OPC tool 34 illustrated in FIG. 1.

FIGS. 12 to 15 are diagrams illustrating the simulation step included in methods for optical proximity correction according to some example embodiments of the present disclosure.

FIGS. 12 to 15 may be diagrams illustrating steps S240 to S280 of FIG. 5. As described above, a contour CON2 may be extracted by performing the simulation using the second OPC model OM2 generated by the methods for optical proximity correction according to the example embodiments of the present disclosure, and the design data may be acquired based on this.

Figure 12:
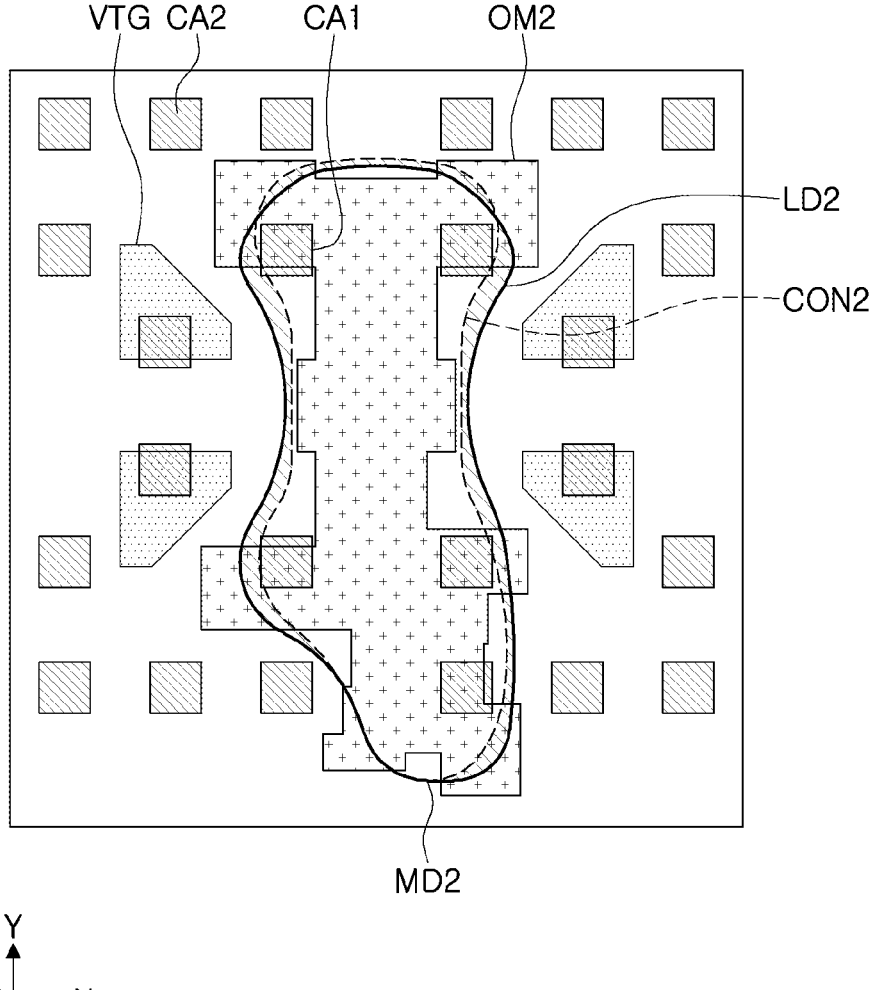
FIGS. 12, 13A to 13C, 14A to 14C, and 15 are diagrams illustrating a simulation step included in methods for optical proximity correction according to some example embodiments of the present disclosure.

Referring to FIG. 12, the second OPC model OM2 may be compensated to make the contour CON2 similar to the shape of the target layer. In methods for optical proximity correction according to the example embodiments of the present disclosure, the compensation of the second OPC model OM2 may be performed based on the movement of the EPE-based fragment and/or the overlap score.

For example, the compensation of the second OPC model OM2 may be performed according to the size of the EPE between the contour CON2 based on the second OPC model OM2 and the target layer, that is, the curved layout data LD2. Also, the compensation of the second OPC model OM2 may be made according to the size of the overlap score of the contour CON2 based on the second OPC model OM2 and the layer adjacent to the target layer.

Figures 13A, 13B, 13C:
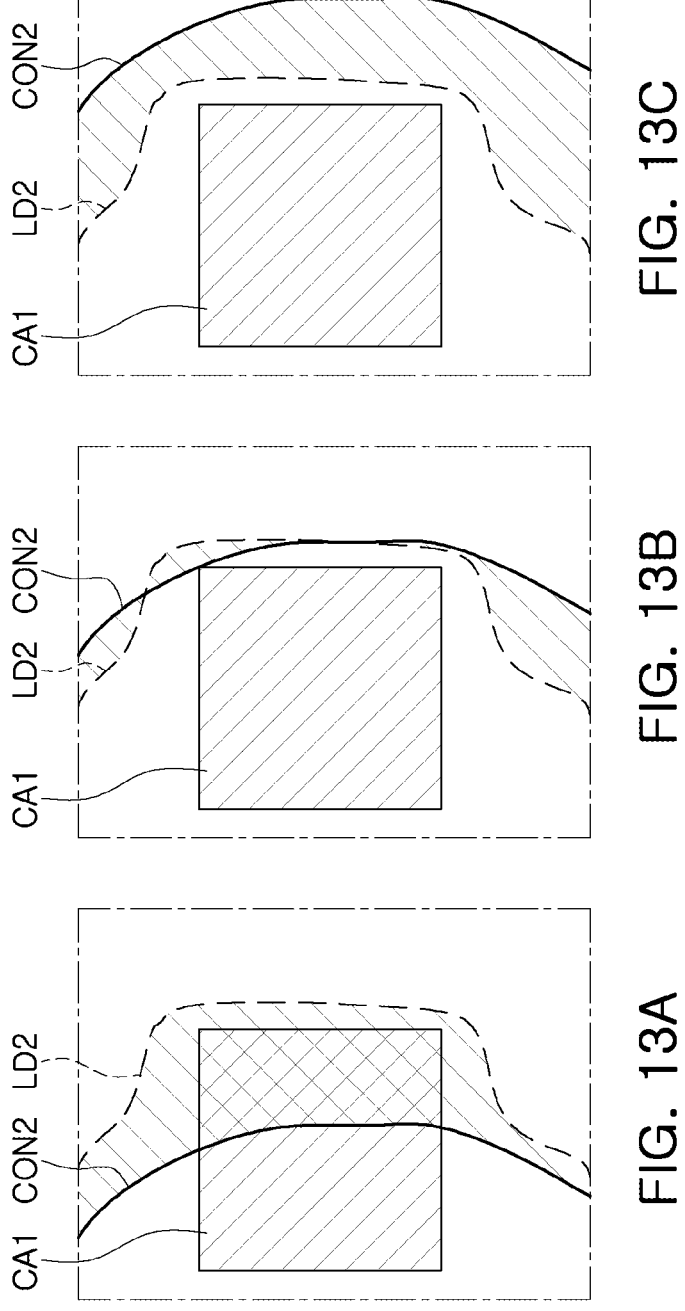

Referring to FIGS. 13A to 13C, the contour CON2 based on the second OPC model may be close to the curved layout data LD2 having the same shape as the target layer by the optical proximity correction. Stated differently, positioning of the contour CON2 may be optimized based on positioning of the curved layout data LD2.

FIG. 13A illustrates an example of a case in which the size of the contour CON2 is smaller than that of the curved layout data LD2, FIG. 13B illustrates an example of a case in which the size of the contour CON2 is similar to the curved layout data LD2, and FIG. 13C illustrates an example of a case in which the size of the contour CON2 is larger than that of the curved layout data LD2. Since the EPE may be considered to be the difference between the contour CON2 and the edge of the target layer, the size of the EPE in FIGS. 13A and 13C may be larger than the size of the EPE in FIG. 13B. Accordingly, the second OPC model using the contour CON2 in FIGS. 13A and 13C as the simulation result may compensate for the direction of decreasing the size of the EPE.

Figures 14A, 14B, 14C:
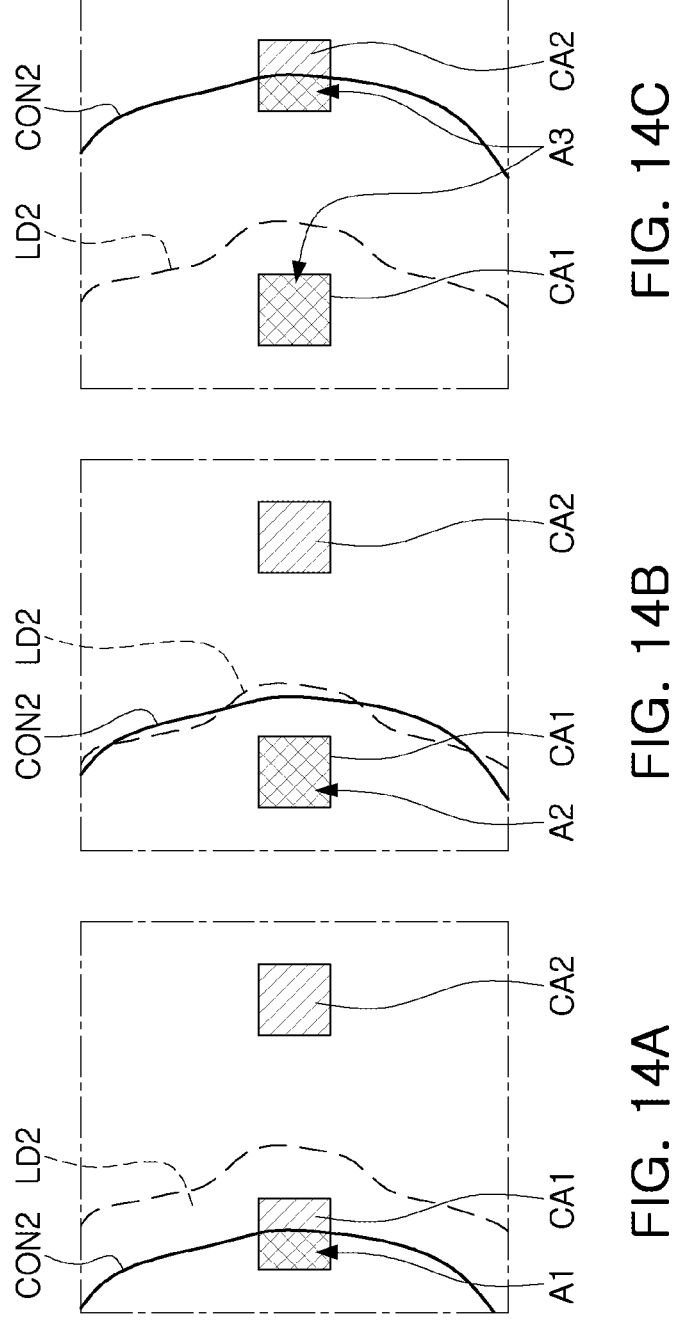

Referring to FIGS. 14A to 14C, even if the contour CON2 based on the second OPC model does not have the exact same shape as the target layer, the occurrence of the pattern defects may be minimized by overlapping the first layer (e.g., first contact CA1) that overlaps the target layer among the adjacent layers and not overlapping the second layer (e.g., second contact CA2) that does not overlap the target layer among the adjacent layers.

FIG. 14A illustrates an example of a case in which the contour CON2 does not completely overlap the first layer (e.g., first contact CA1), FIG. 14B illustrates an example of a case in which the contour CON2 completely overlaps the first layer (e.g., first contact CA1) and does not completely overlap the second layer (e.g., second contact CA2), and FIG. 14C illustrates an example of a case in which the contour CON2 partially overlaps the second layer (e.g., second contact CA2).

In methods for optical proximity correction according to the example embodiments of the present disclosure, as the overlapping area between the contour CON2 and the first layer (e.g., the first contact CA1) increases, the overlap score may have a greater value. For example, since A1 in FIG. 14A is smaller than A2 in FIG. 14B, the overlap score in FIG. 14B may be greater than the overlap score in FIG. 14A.

Meanwhile, as the overlapping area between the contour CON2 and the second layer (e.g., second contact CA2) decreases, the overlap score may have a greater value. For example, in FIGS. 14B and 14C, the contour CON2 completely overlaps with the first layer (e.g., first contact CA1), but since A3 in FIG. 14C is greater than A2 in FIG. 14B, the overlap score in FIG. 14B may be greater than the overlap score in FIG. 14C. However, methods of calculating an overlap score (and thus, the present disclosure) may not be limited to the methods disclosed herein.

Figure 15:
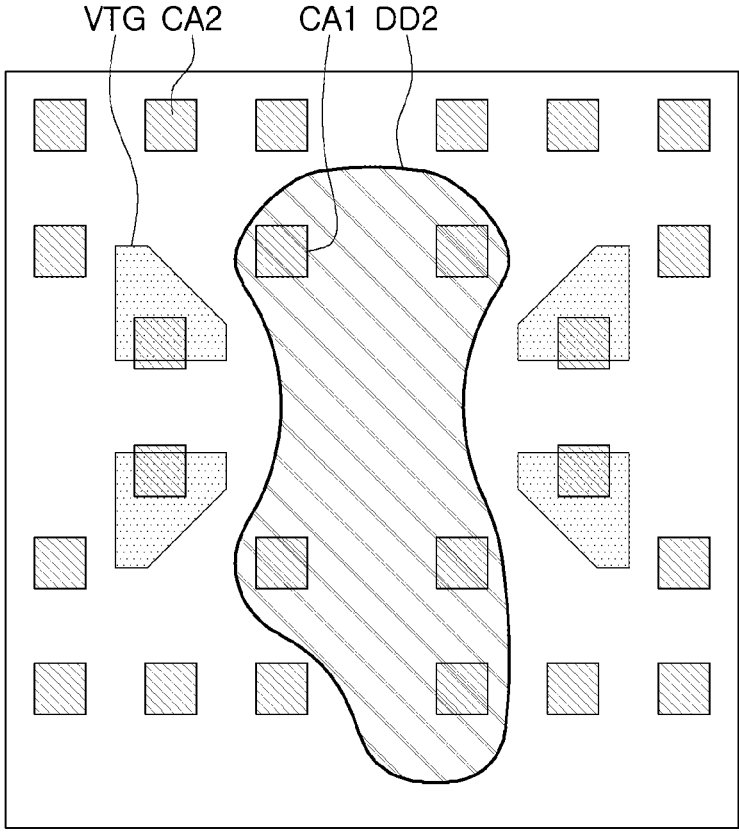
Figure 15:
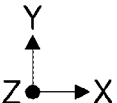

Referring to FIG. 15, the design data acquired by methods for optical proximity correction according to some example embodiments of the present disclosure may be the second design data DD2 distinguished from the first design data DD1 illustrated in FIGS. 4A to 4D. In order to acquire data similar to the target layer, the first design data DD1 needs to be compensated with the first design data DD1', but the second design data DD2 does not require additional compensation such as correction of input data.

The methods for optical proximity correction according to some example embodiments of the present disclosure may acquire design data (e.g., optimal design data) capable of manufacturing the photomask for more accurately forming the target layer without modifying the input layout data by inputting the curved layout data having the same shape as the target layer and performing the manhattanization. In addition, the design data may be further optimized by calculating the overlap score by considering adjacent layers in the optical proximity correction process and generating the OPC model based on the calculated overlap score.

According to some example embodiments, a method for optical proximity correction may obtain design data close to a target layer by using curved layout data as input data and performing manhattanization. Stated differently, positioning of the contour CON2 may be optimized based on positioning of the curved layout data LD2.

According to some example embodiments, a method for optical proximity correction method may improve OPC consistency by calculating an overlap score between a contour of an OPC model and an adjacent layer in a simulation step.

Various and beneficial advantages and effects of the present disclosure are not limited to the contents described above, and may be more easily understood in a process of describing some example embodiments of the present disclosure.

While the present disclosure has been shown and described in connection with some example embodiments, it will be apparent to those in the art that modifications and variations can be made without departing from the scope of the inventive concepts as defined by the appended claims. Accordingly, various types of substitutions, modifications and changes will be possible by those of ordinary skill in the art without departing from the present inventive concepts, and belong to the scope of the present inventive concepts.

What is claimed is:

1. A method for optical proximity correction (OPC), comprising:
  inputting curved layout data corresponding to a target layer to be formed;
  performing manhattanization based on the curved layout data and acquiring manhattanized data;
  performing fragmentation on the manhattanized data and decomposing the manhattanized data into a plurality of data components;
  generating an OPC model based on the plurality of data components and performing a simulation on the OPC model to extract a contour of the OPC model;
  calculating an overlap score between the contour of the OPC model and a layer that is adjacent to the target layer;
  adjusting the OPC model based on the calculated overlap score; and
  acquiring design data for forming the target layer based on the simulation result.

2. The method of claim 1, wherein the design data is optimized by performing the simulation and acquiring the design data a plurality of times.

3. The method of claim 2, wherein positioning of the design data is optimized using positioning of the curved layout data.

4. The method of claim 1, further comprising:
  calculating an edge placement error (EPE) between the target layer and the contour of the OPC model after performing the simulation.

5. The method of claim 4, further comprising:
  moving locations of the plurality of data components based on the EPE after performing the simulation.

6. The method of claim 1, wherein the manhattanized data is data in a form of polygons including a pattern using only 0°, 45°, and/or 90° angles.

7. The method of claim 1, wherein arbitrarily adjacent points are set in the curved layout data, and when an angle between two tangents at the arbitrary adjacent points is smaller than a critical angle, the manhattanization is performed based on the two tangents.

8. The method of claim 7, wherein the critical angle is an acute angle greater than 0° and less than 90°.

9. The method of claim 1, wherein the curved layout data has a same shape as an image of the target layer.

10. The method of claim 1, wherein the adjacent layer is a layer of a plurality of layers that includes a first layer that overlaps the target layer and a second layer that does not overlap the target layer.

11. The method of claim 10, wherein as an area in which the contour of the OPC model and the first layer overlap increases, the overlap score has a greater value.

12. The method of claim 10, wherein as an area in which the contour of the OPC model and the second layer decreases, the overlap score has a greater value.

13. The method of claim 10, wherein the second layer includes at least one first pattern that does not overlap the target layer on the same plane as the target layer and at least one second pattern that does not overlap the target layer in a direction that is perpendicular to an upper surface of the target layer.

14. A method for optical proximity correction, comprising:
  inputting curved layout data corresponding to a target layer to be formed;
  performing manhattanization based on the curved layout data and acquiring manhattanized data;
  performing a simulation for correcting an optical proximity effect using the manhattanized data; and
  acquiring design data for forming the target layer without modifying the curved layout data based on the simulation result; and
  wherein after performing the simulation, the optical proximity correction (OPC) is performed based on an overlap score calculated between a contour of the OPC model and a layer that is adjacent to the target layer.

15. The method of claim 14, wherein the overlap score is further calculated based on an overlap between the contour of the OPC model and a feature of the target layer.

16. A method of manufacturing a semiconductor device, comprising:
  performing manhattanization on curved layout data for a target layer, and performing optical proximity correction (OPC) based on the manhattanized data;
  acquiring design data based on the performed optical proximity correction; and
  forming a photoresist pattern on a substrate using a photomask manufactured based on the design data,
  wherein the optical proximity correction further includes calculating an overlap score between a contour of the OPC model and a layer that is adjacent to the target layer, and adjusting the OPC model using the calculated overlap score.

17. The method of claim 16, wherein the target layer corresponds to a floating diffusion region constituting an image sensor.

18. The method of claim 16, wherein the adjacent layer includes a contact and a transfer gate structure constituting an image sensor.

19. The method of claim 16, wherein the target layer has a curved shape or has a "C" shape.

20. The method of claim 16, wherein the overlap score is further calculated based on an overlap between the contour of the OPC model and a feature of the target layer.

\* \* \* \* \*